(12) United States Patent
Miethig et al.

(10) Patent No.: US 6,593,871 B1
(45) Date of Patent: Jul. 15, 2003

(54) AUTOMATIC A/D CONVERT POSITIONING CIRCUIT AND METHOD

(75) Inventors: Michael Miethig, Waterloo (CA); Mark Gidney, Ottawa (CA)

(73) Assignee: Dalsa, Inc., Waterloo (CA)

( * ) Notice: Subject to any disclaimer, the term of this patent is extended or adjusted under 35 U.S.C. 154(b) by 18 days.

(21) Appl. No.: 09/942,688

(22) Filed: Aug. 31, 2001

Related U.S. Application Data

(60) Provisional application No. 60/229,122, filed on Aug. 31, 2000, and provisional application No. 60/229,054, filed on Aug. 31, 2000.

(51) Int. Cl.[7] .............................................. H03M 1/12

(52) U.S. Cl. ...................................... 341/157; 341/155

(58) Field of Search ................................. 341/155, 143, 341/144, 118, 119, 120, 121, 122

(56) References Cited

U.S. PATENT DOCUMENTS

| | | | | |
|---|---|---|---|---|
| 4,565,993 A | 1/1986 | Brian | .......................... | 340/347 |
| 4,675,549 A | 6/1987 | Steffe et al. | ................. | 307/311 |
| 4,788,696 A | 11/1988 | Sakane et al. | ............... | 375/111 |
| 4,908,621 A | 3/1990 | Polonio et al. | ............. | 341/120 |
| 5,287,171 A | 2/1994 | Ohtsubo et al. | ............ | 348/500 |
| 5,406,329 A | 4/1995 | Kashimura et al. | ......... | 348/175 |
| 5,805,233 A | 9/1998 | West | .......................... | 348/537 |
| 5,959,563 A | 9/1999 | Ring | .......................... | 341/155 |
| 6,304,202 B1 * | 10/2001 | Pastorello | .................... | 341/155 |

\* cited by examiner

*Primary Examiner*—Brian Young
(74) *Attorney, Agent, or Firm*—Dorsey & Whitney LLP

(57) ABSTRACT

A circuit includes a programmable delay circuit to provide a sequence of delayed pulses, an A/D circuit to convert a sequence of values into digital values sampled at times defined by the sequence of delayed pulses, and a jitter correction circuit to adjust the programmable delay circuit based on a sequence of digital values from the A/D circuit sampled at times defined by the sequence of delayed pulses.

20 Claims, 7 Drawing Sheets

AUTOMATIC A/D CONVERT POSITIONING CIRCUIT AND METHOD

The priority benefits of the Aug. 31, 2000 filing date of provisional application Ser. No. 60/229,122 and of the Aug. 31, 2000 filing date of provisional application Ser. No. 60/229,054 are hereby claimed.

BACKGROUND OF THE INVENTION

1. Field of the Invention

The present invention relates to positioning the sample time of an analog to digital converter in a periodic waveform.

2. Description of Related Art

It is desired to be able to position the A/D converter pulse in a very narrow window of time and to perform the correct placement over various temperature ranges, supply voltage variations, and component lot to lot variations. In the past, the window of time was set large enough so that any variations in the time placement would not exceed the window width. However, now that there is a greater demand for faster camera sensors and other equipment, this window has shrunk and the old method is no longer adequate. In the past, the time window of the A/D converter position was large enough to accommodate slight variations due to temperature variations, voltage variations and lot to lot variations. The new method is an improvement because it will now be possible to shrink the convert window, and as a result, be able to increase the maximum frequency of operation and provide optimal performance over all operating conditions.

Such variations as clock driver lot to lot variations, voltage and temperature delay variations, analog processing lot to lot variations, timing generation lot to lot variations, and A/D aperture delay lot to lot variations are critical at high speed where timing margin is near zero. These variables are continuously monitored with the present invention and corrected using a digital algorithm and a new delay line capable of "jittering" the sample pulse for one full clock period.

SUMMARY OF THE INVENTION

It is an object to the present invention to automatically position the sample time of an analog to digital converter.

These and other objects are achieved in a circuit that includes a programmable delay circuit, an A/D circuit triggered by the programmable delay circuit and a jitter correction algorithm processor coupled to insert a standard signal into the A/D circuit and to control the programmable delay circuit.

Alternatively, these objects are achieved with a method that includes steps of measuring a calibration function, correlating the measured calibration circuit with a known function, and determining a jitter control delay value from a result of the step of correlating.

BRIEF DESCRIPTION OF DRAWINGS

The invention will be described in detail in the following description of preferred embodiments with reference to the following figures wherein.

DETAILED DESCRIPTION OF PREFERRED EMBODIMENTS

Figure 1:
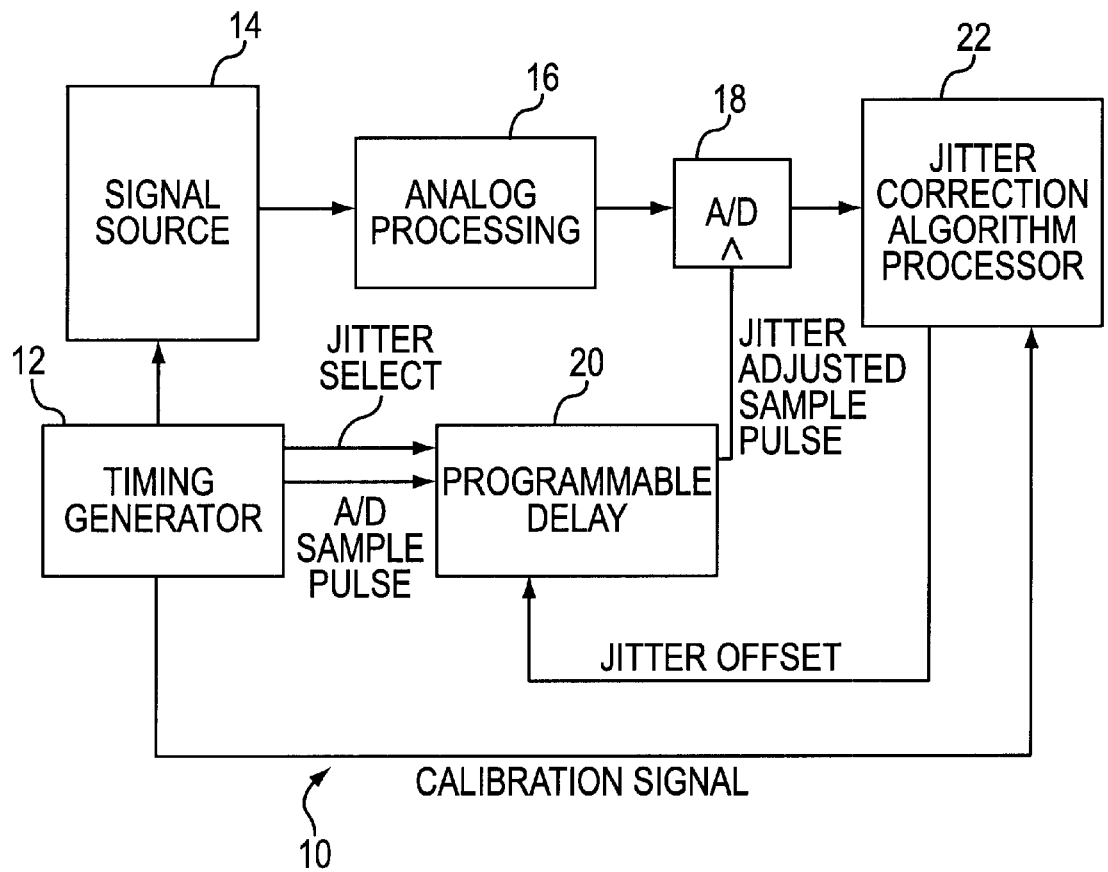
FIG. 1 is a block diagram of a representative circuit of the invention.

In FIG. 1, circuit 10 includes timing generator 12 for generating timing and control signals to control signal source 14. Signal source 14 is preferably a CMOS or CCD imaging sensor with associated clock drivers, but could be another type of source such as a communications source such as an "eye" detector. Source 14 generates an analog data signal that includes a test signal incorporated in the signal datastream. The signal datastream, including test signal, is processed through analog processor 16 through to analog to digital converter 18 (A/D converter or ADC). Timing generator 12 also produces an A/D sample pulse that passes through programmable delay circuit 20 to provide a jitter adjusted sample pulse to be used as the sample trigger for A/D converter 18. The digital sampled data from A/D converter 18 is provided to and processed by jitter correction algorithm processor 22. The test signal in the datastream is a calibration signal that is periodically inserted in the signal datastream. For example, in the case of a CCD or CMOS sensor, a pixel data line is read out to include a couple of "dark" pixels, a line of signal pixels, a couple more "dark" pixels and a test pixel, actually a reference white pixel, and the data line is repeated. In the case of communication system, a test signal might be a reference "eye" inserted in the datastream.

Timing generator 12 also provides to jitter correction algorithm processor 22 a calibration signal to indicate when a test signal is present in the datastream sampled by A/D converter 18. In any particular design, the calibration signal may be a pulse in advance of the actual test signal in the datastream. In order to control the programmable delay circuit 20, jitter correction algorithm processor 22 issues a jitter offset signal to the programmable delay circuit 20. Timing generator 12 also provides a jitter select signal to programmable delay circuit 20. The jitter select signal causes programmable delay circuit 20 to jitter the delay through programmable delay circuit 20 (i.e.,jitter the jitter adjusted sample pulse) by an amount defined by the jitter offset received from jitter correction algorithm processor 22. However, timing generator 12 controls the timing of the datastream from signal source 14 and the jitter select signal so that the jitter adjusted sample pulse is only jittered when the test signal is present in the datastream and about to be sampled by A/D converter 18. This will be described in further detail with respect to a discussion of programmable delay circuit 20.

Jitter correction algorithm processor 22 collects digital data corresponding to the output of A/D converter 18 when the test signal is being digitally sampled. Typically, 5 to 30 different sample positions, preferably 10 to 20 sample positions, spanning a critical time interval, are used to sample the test signal by A/D converter 18. At each sample position, plural samples may be take to obtain averages. For example, with a CCD or CMOS sensor having 525 lines of pixels (as in an NTSC TV television standard), each frame provides 525 opportunities to measure the test signal. Jitter correction algorithm processor 22 maybe structured to collect 35 data samples at each jittered position of 15 sample position spanning the test signal (15*35=525). For each of the 15 sample positions, the 35 samples taken at the sample position are averaged to determine the mean signal strength at the sample position, and a square root of a variance of the 35 samples around the mean signal strength at the sample position is determined as a measure of the noise. From this, the signal to noise ratio at each jittered sample position can be determined. The mean signal strength at all the 15 sample positions defines a measured test function or calibration function.

The calibration function is correlated with a known reference function to determine the optimum sample point as discussed below. Alternatively, a maximum value of the signal to noise ratio is selected from the plural sample positions (e.g., 15 sample positions in this case).

Figure 2:
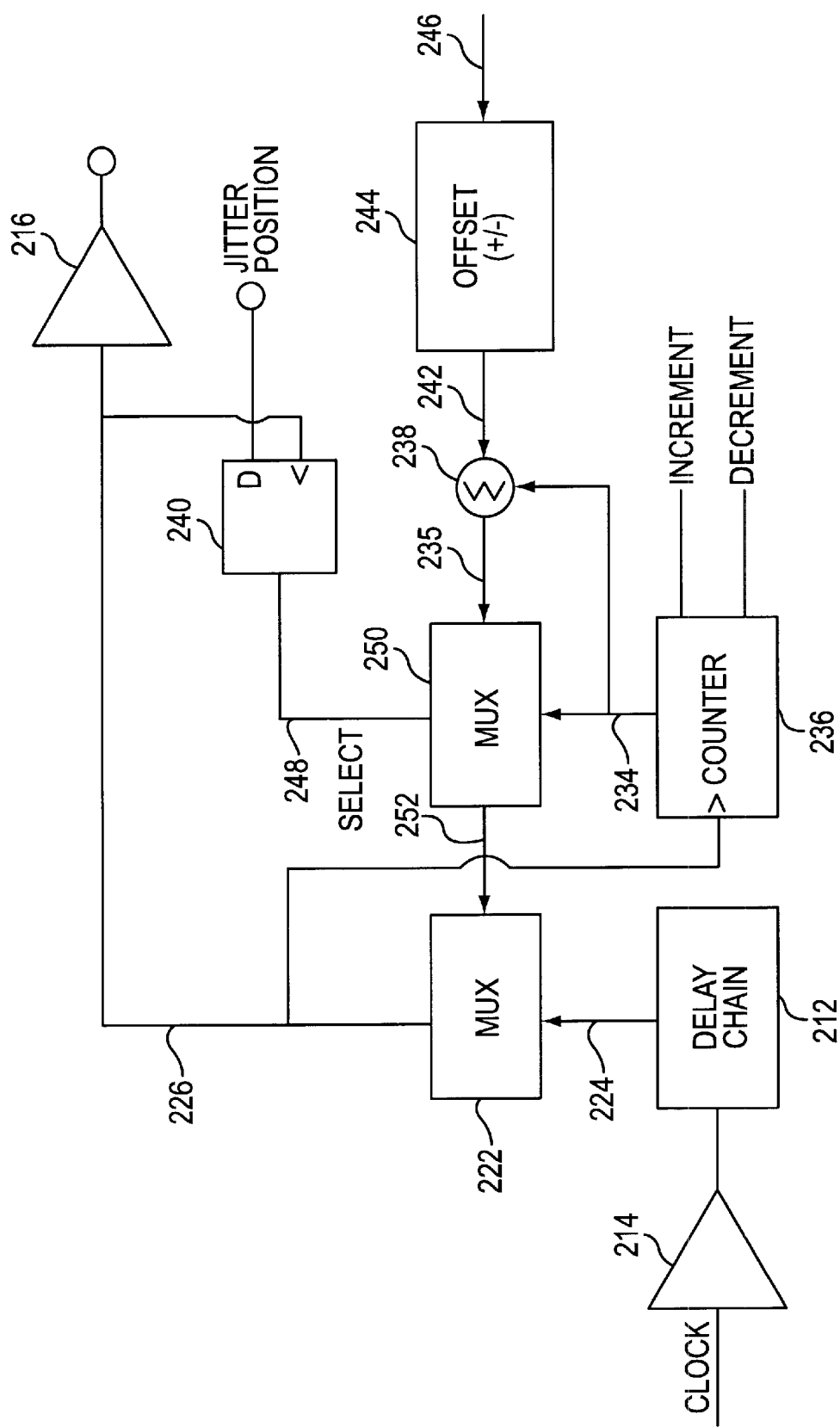
FIG. 2 is a block diagram of the programmable delay circuit of the invention.

In FIG. 2, A/D sample pulse from timing generator 12 is provided to an input of input buffer 214 as a clock signal. Input buffer 214 provides the clock pulse to delay chain 212. Delay chain 212 includes plural inverter circuits in a chain (for example, 128 or 256 inverter circuits) generating a multi-tap delay line. Multiplexer 222 is coupled to the plurality of taps generated by delay chain 212 and controlled by shift signal 252 to select a single tap signal 226 that is provided to an input of output buffer 216 that provides the jitter adjusted sample pulse to A/D converter 18.

In FIG. 2, jitter offset signal 242 is an offset to circuit delay signal 234. Jitter offset signal 246 from jitter correction algorithm processor 22 is stored in register 244 (or register 244 might be the output register of processor 22) as signal 242 and added to circuit delay signal 234 in adder 238 to provide jittered signal 235. Tap counter 236 provides circuit delay signal 234 where either signal INCREMENT or signal DECREMENT (from processor 22) increments or decrements counter 236 synchronously with the pulse signal 226. Multiplexer 250 provides shift signal 252 by selecting either circuit delay signal 234 or jittered signal 235 according to a value of select signal 248. Select signal 248 comes either directly from timing generator 12 or, preferably, from D type flip flop 240 (as shown) that is set synchronously by pulse signal 226 where the jitter position input to D type flip flop 240 comes from timing generator 12.

In operation, a clock pulse (e.g., A/D sample pulse from timing generator 12) passes through input buffer 214 and enters delay chain 212. Multiplexer 222 selects single tap 226 from all taps 224 of delay chain 212 based on shift signal 252 used as a selection address. Single tap 226 passes through output buffer 216 to trigger a sample at A/D converter 18 (see FIG. 1). Shift signal 252 is provided by multiplexer 250 by selecting either circuit delay signal 234 or jittered signal 235 according to a value of select signal 248.

Assume for a moment that select signal 248 is set so that multiplexer 250 selects only circuit delay signal 234 to be provided as shift signal 252. In this case, processor 22 is free to increment or decrement counter 236 to adjust the delay between when a clock pulse enters input buffer 214 and exits output buffer 216. The question is, how does processor 22 know whether to increment or decrement?

To understand this, assume that the circuit of FIG. 2 is used to input the A/D sample pulse from timing generator 12 and to output a pulse timed to strobe A/D converter 18 that samples the sensor's output video data stream. Assume further that the video data stream (a single analog signal) has, in sequence, a couple of dark pixels, a line of data pixels, a couple more dark pixels and then a reference white pixel, and the sequence repeats. Processor 22 is now able to increment or decrement counter 236 based on data received that corresponds to the reference white pixel.

To measure and determine a desired offset, processor 22 loads an offset into offset register 244 that is selected within a range from minus a value to plus the value (e.g. 15 sample positions from −7 to +7 as discussed in the example above): Then, just before the last pixel before the reference white pixel is being read out, the jitter position signal from processor 22 is set to be loaded in D type flip flop 240 when A/D converter sample pulse for the last pixel passes through output buffer 216. This causes multiplexer 250 to provide jittered signal 235 as shift signal 252. Now, when the reference white pixel is converted in A/D converter 18 based on the jittered timing of a strobe from output buffer 216, its sample point will be jittered plus or minus around the count located in counter 236 according to the value in jitter register 244.

Just before the pulse that strobes the reference white pixel passes through output buffer 216, the jitter position signal from processor 22 is reset so that upon the strobe, D flip flop 240 is reset and multiplexer 250 again provides circuit delay signal 234 from counter 236 as shift signal 252. The result of this measurement process is that a single A/D converter sample has been taken of the reference white pixel at a strobe time defined by offset jitter signal 246 for each line from the datastream.

This process is repeated for each video line of the sensor, collecting one calibration sample at a jittered position for each line. After a number of lines, the reference white pixel will have been sampled over a sequence of offset jitter times so as to trace out a complete timeline of the reference white pixel in what is referred to as a calibration function. Processor 22 then correlates this calibration function with a similar known function to determine the optimal time position for A/D converter sampling. Alternatively, processor 22 determines the jitter offset that produces a sample position that exhibits the greatest signal to noise ratio, and then determines the optimal time position for A/D converter sampling based on a maximum signal to noise ratio. Processor 22 then increments or decrements counter 236 to adjust the sampling time of the rest of the video lines following a determination that the optimal sample time has shifted.

This jitter process determines whether or not a convert position is optimal. Typically, only one pixel is used to determine the optimal position of, for example, an A/D converter convert pulse. The increment and decrement signals are provided to control tap counter 236. This tap counter implements a programmable delay that is updated once per frame based on plural samples collected once per line via an algorithm inside processor 22.

Figure 3:
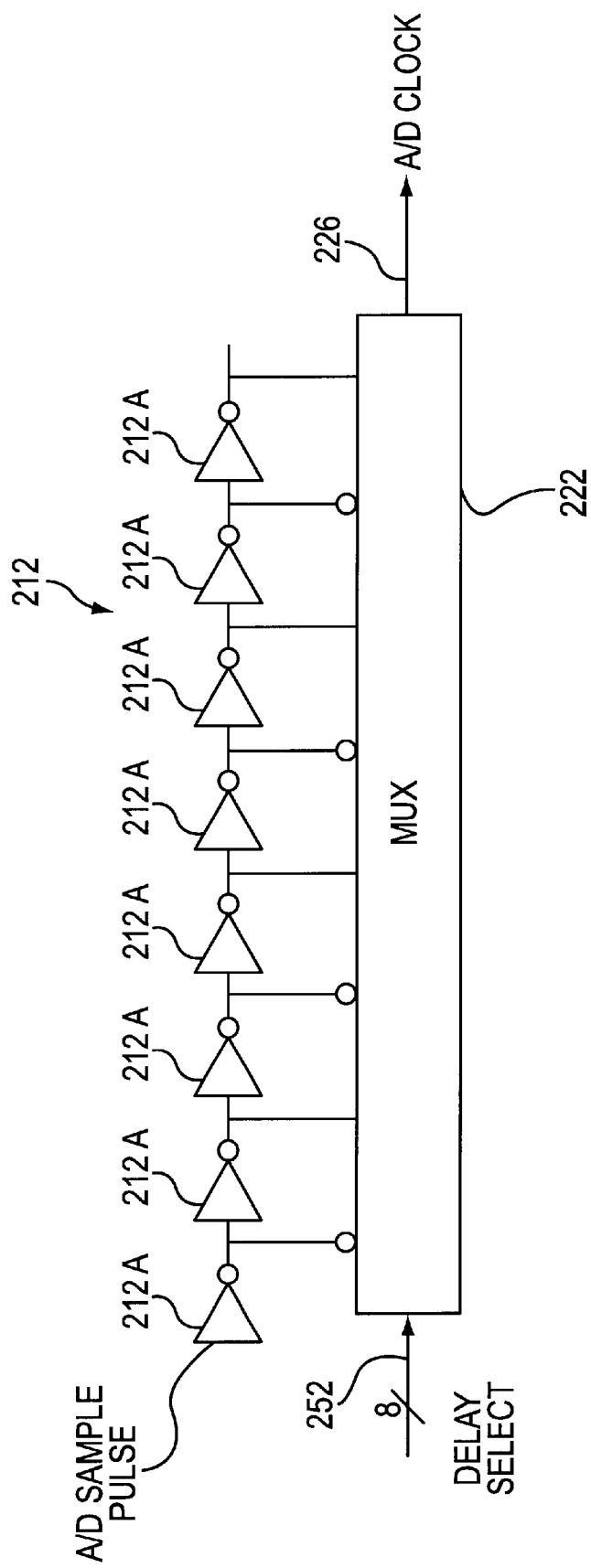
FIG. 3 is a schematic diagram of a delay line and multiplexer of the invention.

In FIG. 3, programmable delay circuit 20 includes plural inverter circuits 212A in a chain (for example, 128 or 256 inverter circuits). The inverter chain is tapped at various points by multiplexer 222 according to shift signal 252 (a delay select signal) provided to the multiplexer. The A/D sample pulse from timing generator 12 is provided into the input of the inverter chain, and the output of the multiplexer 222 is an A/D clock that carries the jitter adjusted sample pulse.

Figure 4:
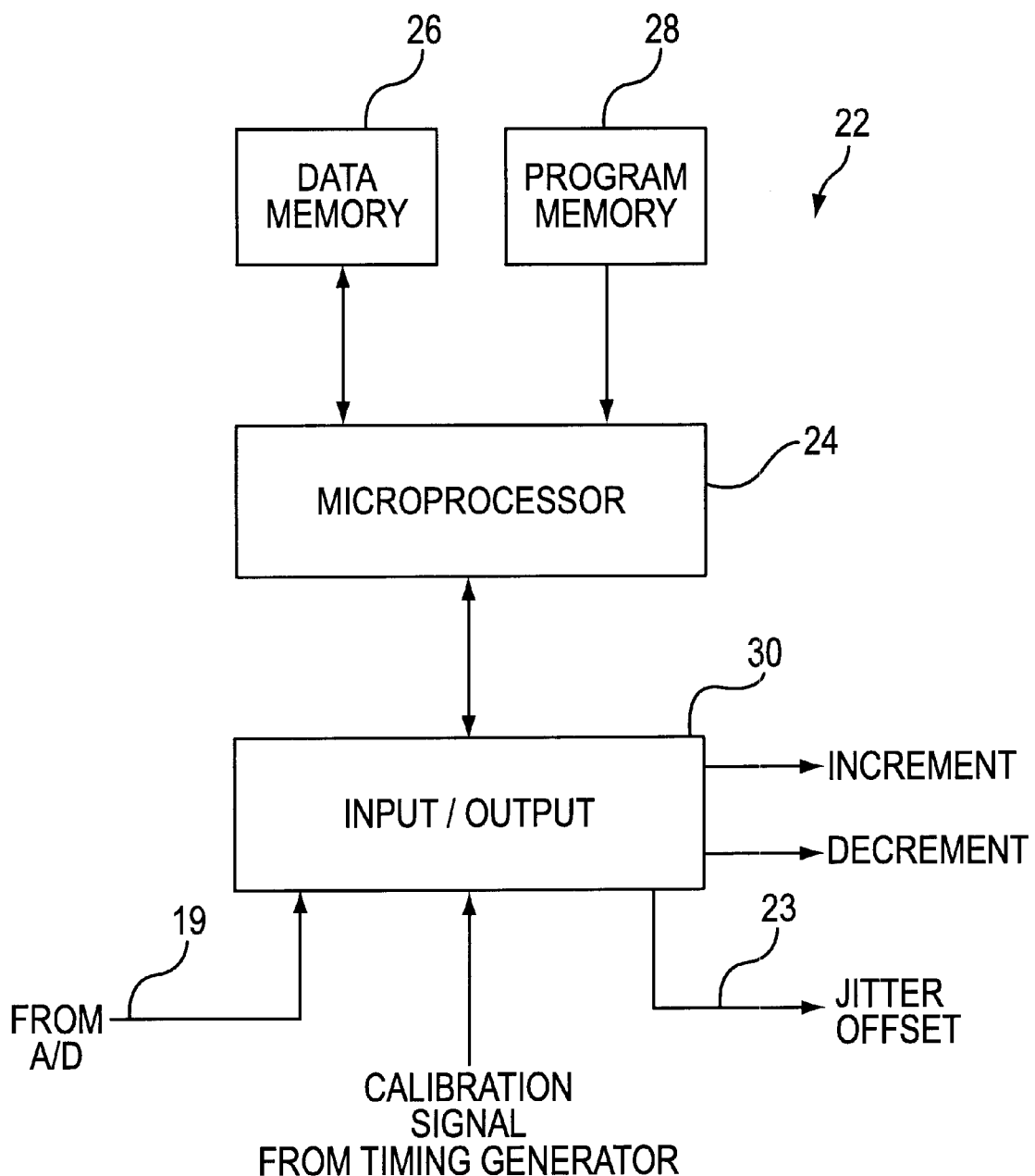
FIG. 4 is a block diagram of a jitter correction algorithm processor.

In FIG. 4, jitter correction algorithm processor 22 includes a microprocessor 24, data memory 26, program memory 28 and input/output logic 30, or other suitable processing arrangement (e.g., ASIC, FPLA, etc.). Processor 22 receives as inputs the digitized signal 19 from A/D converter 18 and a calibration signal from timing generator 12 that identifies when a reference test signal will be sampled by A/D converter 18. Processor sends as output jitter offset 23 to programmable delay circuit 20 to jitter the sample time of each reference test signal embedded in the datastream. When sufficient jittered data has been sampled to determine that an offset is needed for all data being sampled, increment and decrement commands to the tap counter are issued by processor 22. In processor 22, the jitter correction algorithm will shift the position of the A/D converter clock (using increment and decrement), in time, based on a generalized performance (jitter correction) algorithm. Utilization of a pre-specified "white" pixel is employed in the jitter correction algorithm, or in cases where the "white" pixel is not available, any standard imaging pixel can be utilized. The algorithm functions in a manner to optimize (maximize) the response due to the aforementioned "white" pixel and/or minimize noise. The algorithm works by moving the A/D converter sample clock back or ahead in time while monitoring the output response due to the selected reference pixel. The moving back or ahead in time of the A/D converter sample clock is performed by a new programmable delay circuit (FIG. 2). The delay select signal chooses which tap of the inverter chain to direct the A/D converter sample clock signal and hence can control the delay to a resolution determined by the propagation delay through one inverter.

This invention will allow, for example, a camera, to operate reliably at higher frequencies. The programmable delay circuit part of the invention may be used in other applications that require the use of a programmable delay that can be changed "on the fly".

Typically, CMOS buffers will have plus or minus 1 nanosecond drift over the operating temperatures and voltages. This drift, lot to lot, is about 5 nanoseconds according to many data sheets. An A/D converter has about plus or minus 0.5 nanoseconds drift over temperature and voltages of aperture delay. Lot to lot delay may be assumed to be plus or minus 1.5 nanoseconds. Adding up the delays one gets approximately 10 nanoseconds variability, lot to lot, and plus or minus 1.5 nanoseconds over temperature. This assumes stable analog delays. In a sensor chip with correlated double sampling with overdrive, the delay has about a 3 nanosecond window. The programmable delay line approach should compensate for variations in a range from minus 1.5 nanoseconds to plus 14.5 nanoseconds (a 16 nanoseconds range). The resolution should be at least 5 steps in a 3 nanosecond window. This translates to 0.6 nanoseconds per step. Preferably 10 steps would be available in a 3 nanosecond window, or 0.3 nanoseconds. Therefore, to achieve a variable delay in a range from minus 1.5 nanoseconds to 14.5 nanoseconds (a 16 nanosecond range), 32 steps might be required at 0.5 nanoseconds per step.

Sometimes inductance-capacitance cells may be used for delay lines; however, phase jitter due to unrelated switching may result in and create undesirable effects. Furthermore such delay lines are not consistent, lot to lot, or part to part, or over temperature.

Figure 5:
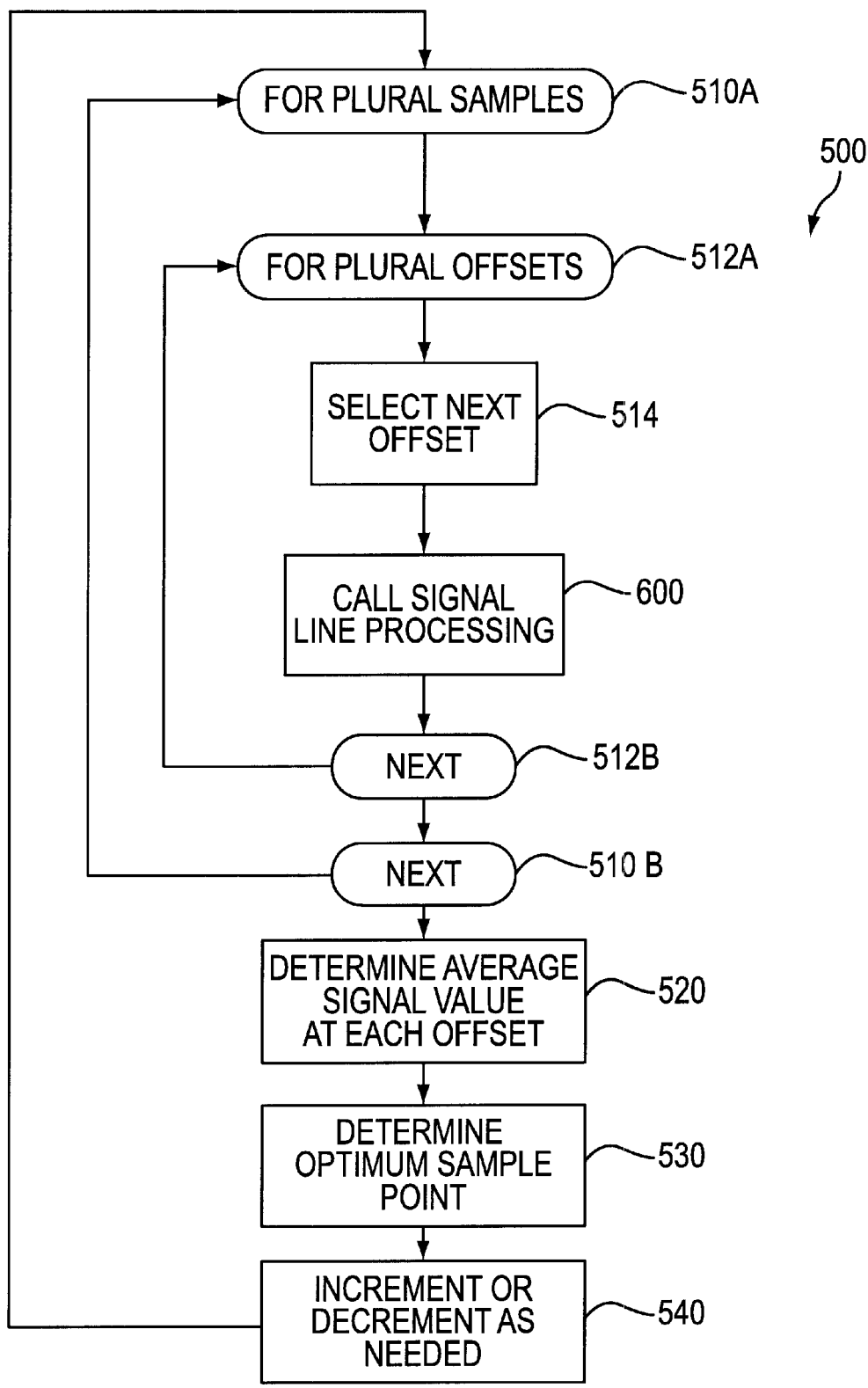
FIG. 5 is a flow chart of a representative algorithm according to the invention.

In FIG. 5, a flow chart of the jitter correction algorithm includes loop controls 510A, 510B, 512A and 512B. Loop controls 510A and 510B merely loop enough times to obtain sufficient calibration samples to perform good averaging. In the NTSC example discussed above, 35 loops are performed. Loop controls 512A and 512B alter the jitter offset for the measurements. In the NTSC example discussed above, 15 loops are performed. At the beginning of each loop, the next offset (not the current one being measured) is selected at step 514, and the algorithm calls signal line processing 600, a step discussed below with respect to FIG. 6.

Figure 7:
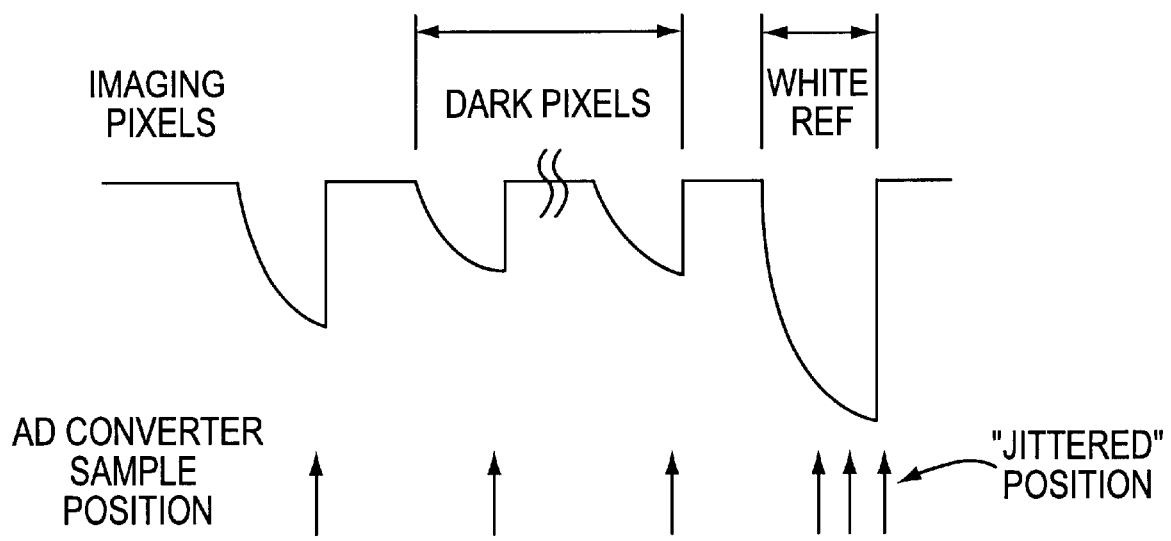
FIG. 7 is a graph illustrating the signal into the A/D converter that is processed by the invention based on an imaging sensor chip as a signal source where imaging pixels are preceded by a "white" calibration reference then two dark pixels (the jittered position is illustrated).

After all loops are performed by loop controls 510A, 510B, 512A and 512B, the stored data is processed in step 520. This might mean an end of a frame of signal lines as in the NTSC example discussed above, or it might mean at the end of a predetermined number of signal lines whether or not organized in frames. In step 520, the data is set into bins corresponding to each jittered offset. All test signal values within a bin (i.e., a single offset value) are averaged. FIG. 7 depicts a representative graph of a signal datastream with a white reference test signal at the end of the datastream. In the NTSC example discussed above, the 15 averaged sample values will trace out a curve that is a discrete time sampled version of the white reference test signal.

In step 530, a new optimum sample point is determined. One way to do this is to determined the signal to noise ratio of measured data at each sample point. The signal is the average signal value determined by step 520. A noise metric at each jittered offset is determined by calculating, for example, the square root of a variance about the mean of all test signal values within a bin (i.e., at a single offset value). Then, the ratio can be determined. The greatest signal to noise value indicates the optimum signal point. Presumably, the noise is somewhat consistent at each jittered sample point, thus, the signal noise ratio will tend to peak where the averaged signal is greatest. The optimal sample point is taken as the offset where the signal to noise ratio is greatest.

Alternatively, the optimal sample point may be determined by correlating in time the measured calibration function (i.e., the averaged measurements at each jitter sample position) with a known calibration function and choosing the expected optimal point of the known function based on an offset of the measured calibration function from a known calibration function.

In step 540, the value of tap counter 236 (FIG. 2) is incremented or decremented to adjust the count value to perform optimal sampling at all points in the datastream, not just the test signal. For example, if jittered offsets are tested between −7 and +7 tap positions relative to the value of tap counter 236, where the 0 tap position is taken to be the current value of the tap counter, and if the optimal jittered offset is calculated to be +1, then the tap counter will be incremented. Then, during the next frame of data (or plurality of lines of data, if not organized in frames), the optimal jittered offset will be reduced to a 0 tap position again unless further delay line jitter occurs.

Figure 6:
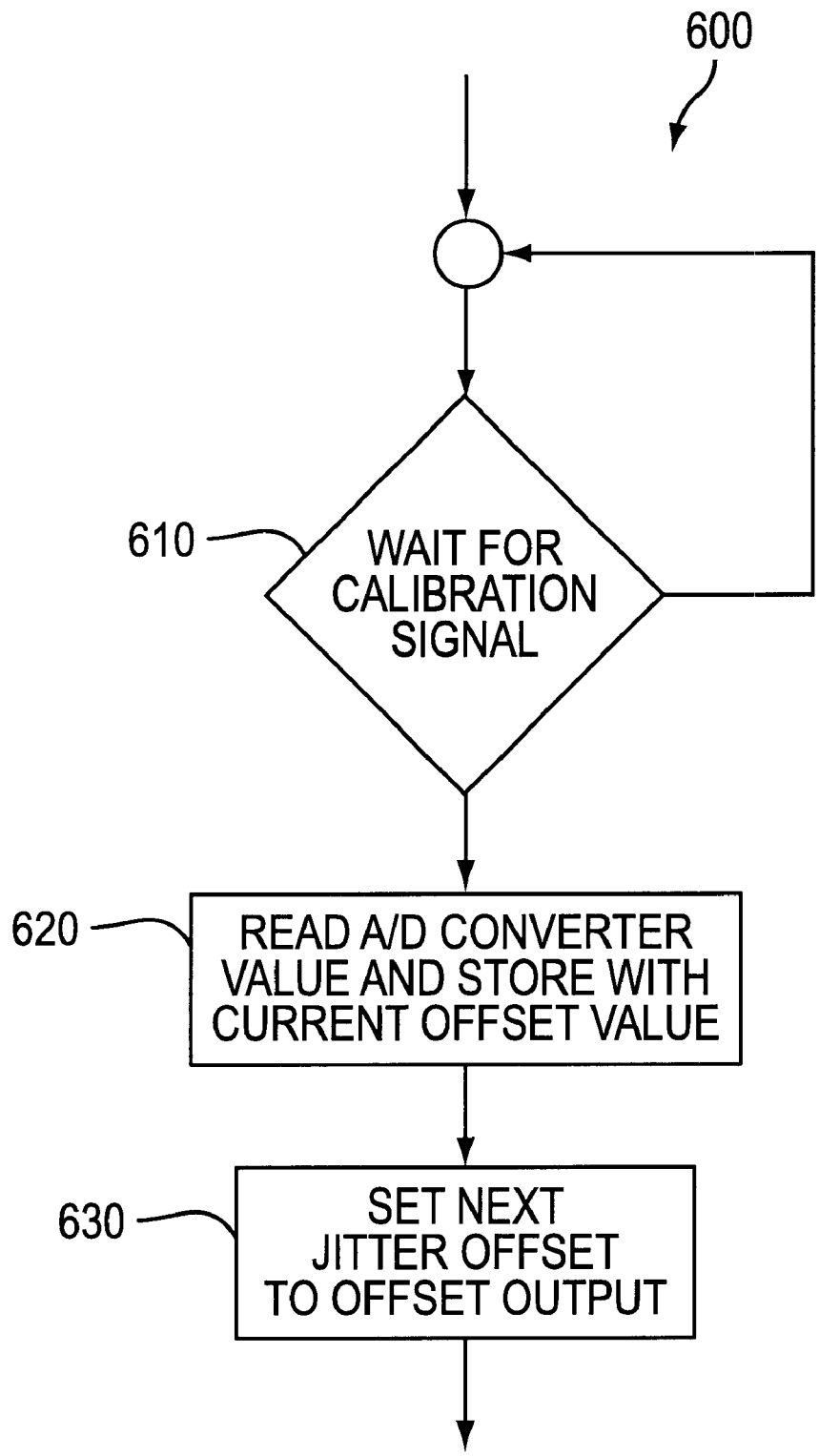
FIG. 6 is a flow chart of a representative method to measure the calibration function according to the invention.

In FIG. 6, signal line processing 600 includes the steps of step 610 of waiting for the calibration signal from the timing generator, step 620 of reading the A/D converter value and storing it with the current offset value, and step 630 of setting up the next offset value by outputting the next offset value to programmable delay circuit 20 to be ready for the next time that timing generator 12 strobes programmable delay circuit 20 with a jitter select.

In FIG. 7, there is illustrated a timeline of a signal source coming from a pixel line of an imaging sensor. A white reference pixel is included in the datastream. The jitter position is shown with the white reference pixel to be varied over a limited range where the white reference pixel has its maximum value. Once this variation is sampled and correlated according to the jitter correction algorithm, the correct value for the jitter delay is set for the next line.

Having described preferred embodiments of a novel A/D convert positioning circuit and method (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as defined by the appended claims.

Having thus described the invention with the details and particularity required by the patent laws, what is claimed and desired protected by Letters Patent is set forth in the appended claims.

What is claimed is:

1. A circuit comprising:
    a programmable delay circuit to provide a strobe;
    an A/D circuit triggered by the strobe; and
    a jitter correction algorithm processor coupled to control the programmable delay circuit to jitter in time the strobe when a test sample is input into the A/D circuit.

2. A circuit comprising:
    a programmable delay circuit to provide a sequence of delayed pulses;
    an A/D circuit to convert a sequence of values into digital values sampled at times defined by the sequence of delayed pulses; and
    a jitter correction circuit to adjust the programmable delay circuit based on a sequence of digital values from the A/D circuit sampled at times defined by the sequence of delayed pulses.

3. The circuit of claim 2, further comprising a timing generator, wherein timing generator provides the jitter correction circuit with a calibration signal to define when a test signal will be input into the A/D converter.

4. The circuit of claim 3, wherein the jitter correction circuit includes:
    an input to receive the sequence of digital values and the calibration signal;
    an output to provide a jitter offset;
    a processor coupled to the input and to the output; and
    a memory coupled to the processor.

5. The circuit of claim 4, wherein the jitter correction circuit includes a line processing module stored in the memory to control the processor, wherein the line processing module includes:
    a sub-module to wait for receipt of the calibration signal;
    a sub-module to read a value from the A/D converter and store the value and a current offset in a data memory; and
    a sub-module to provide a next jitter value to the programmable delay circuit.

6. The circuit of claim 5, wherein the jitter correction circuit further includes:
    a module to select a next jitter offset; and
    a module to iteratively repeat the module to select a next jitter offset and the sub-modules of the line processing module.

7. The circuit of claim 6, wherein the jitter correction circuit further includes:
    a module to determine a calibration function;
    a module to determine an optimum sample point from the calibration function; and
    a module to adjust the programmable delay circuit based on the optimum sample point.

8. The circuit of claim 2, wherein the jitter correction circuit includes:
    an input to receive the sequence of digital values;
    an output to provide the jitter control delay value and a multiplexer control signal, the multiplex control value being coupled to the multiplexer;
    a processor coupled to the input and to the output; and
    a memory coupled to the processor.

9. The circuit of claim 8, wherein the memory has stored therein modules for controlling the processor, the modules including:
    a first module to control the processor to measure a test signal transmitted as part of a datastream at a plurality of offsets from a nominal sample time;
    a second module to control the processor to determine an average measured value at each offset; and
    a third module to control the processor to determine an optimal offset from the nominal sample time.

10. The medium of claim 9, further comprising a fourth module to control the processor to adjust a programmable delay circuit according to the optimal offset.

11. The medium of claim 9, wherein the first module includes:
    a first sub-module to control the processor to select an offset for a next test sample;
    a second sub-module to control the processor to wait for a calibration signal from a timing generator;
    a third sub-module to control the processor to measure a digital value of the test signal at a current offset when the calibration signal is received; and
    a fourth sub-module to control the processor to set the selected next offset in a programmable delay circuit.

12. The circuit of claim 2, wherein the circuit is a circuit integrated on a single chip.

13. The circuit of claim 2, wherein the circuit is part of a sensor integrated on a single chip.

14. A circuit comprising:
    a programmable delay circuit;
    an A/D circuit triggered by the programmable delay circuit; and
    a jitter correction algorithm processor coupled to examine a test signal transmitted as part of a data stream and to control the programmable delay circuit.

15. A method comprising steps of:
    measuring a test signal transmitted as part of a datastream at a plurality of offsets from a nominal sample time;
    determining an average measured value at each offset; and
    determining an optimal offset from the nominal sample time.

16. The method of claim 15, further comprising a step of adjusting a programmable delay circuit according to the optimal offset.

17. The method of claim 15, wherein the step of measuring a test signal includes steps of:
    selecting an offset for a next test sample;
    waiting for a calibration signal from a timing generator;
    measuring a digital value of the test signal at a current offset when the calibration signal is received; and
    setting the selected next offset in a programmable delay circuit.

18. A computer readable medium having stored therein modules for controlling a processor, the modules including:

a first module to control the processor to measure a test signal transmitted as part of a datastream at a plurality of offsets from a nominal sample time;

a second module to control the processor to determine an average measured value at each offset; and a third module to control the processor to determine an optimal offset from the nominal sample time.

19. The medium of claim 18, further comprising a fourth module to control the processor to adjust a programmable delay circuit according to the optimal offset.

20. The medium of claim 18, wherein the first module includes:

a first sub-module to control the processor to select an offset for a next test sample;

a second sub-module to control the processor to wait for a calibration signal from a timing generator;

a third sub-module to control the processor to measure a digital value of the test signal at a current offset when the calibration signal is received; and a fourth sub-module to control the processor to set the selected next offset in a programmable delay circuit.

\* \* \* \* \*